United States Patent [19]

Griep

[11] Patent Number: 5,221,643
[45] Date of Patent: Jun. 22, 1993

[54] METHOD FOR PRODUCING POLYCRYSTALLINE SEMICONDUCTOR MATERIAL BY PLASMA-INDUCED VAPOR PHASE DEPOSITION USING ACTIVATED HYDROGEN

[75] Inventor: Susanne Griep, Neubiberg, Fed. Rep. of Germany

[73] Assignee: Siemens Aktiengesellschaft, Munich, Fed. Rep. of Germany

[21] Appl. No.: 664,481

[22] Filed: Mar. 4, 1991

Related U.S. Application Data

[63] Continuation of Ser. No. 477,532, Feb. 9, 1990, abandoned.

[30] Foreign Application Priority Data

Feb. 21, 1989 [DE] Fed. Rep. of Germany ....... 3905297

[51] Int. Cl.5 .................... H01L 21/00; H01L 21/02; H01L 21/469
[52] U.S. Cl. .................................. 437/233; 437/937; 437/967; 437/38; 437/39; 148/DIG. 122
[58] Field of Search ............. 437/225, 228, 233, 937, 437/967; 427/38, 39, 45.1; 148/DIG. 122

[56] References Cited

U.S. PATENT DOCUMENTS

| 4,401,054 | 8/1983 | Matsuo et al. . | |
|---|---|---|---|
| 4,615,905 | 10/1986 | Ovshinsky et al. | 437/233 |
| 4,701,343 | 10/1987 | Ovshinsky et al. | 437/225 |
| 4,716,852 | 1/1988 | Tsujii et al. . | |
| 4,908,330 | 3/1990 | Arai et al. | 437/937 |
| 4,914,052 | 4/1990 | Kanai | 437/937 |

FOREIGN PATENT DOCUMENTS

| 0024378A | 3/1981 | European Pat. Off. . |
| 0143701 | 2/1983 | European Pat. Off. . |
| 0143701A | 6/1985 | European Pat. Off. . |

OTHER PUBLICATIONS

Shibata, Preparation of Polycrystalline Silicon by Hydrogen-Radical-Enhanced Chemical Vapor Deposition, Jap. Jour. of Appl. Phys., vol. 26, No. 1, Jan. 1987, pp. L10-L13.

Wolf, S., Silicon Processing for the VLSI Era, vol. 1, p. 171, Lattice Press, 1986.

Hashimoto et al., Effect of Electrical Conductivity of Substrate on RF-Sputter Deposition of uc-Si:H at −180° C., Japanese Journal of Applied Physics, vol. 22, No. 11, Nov. 1983, pp. L748-L750.

Nakazawa et al., A Thin-Film Transistor Using a Reactive-Ion-Beam-Deposited Polycrystalline Silicon Film, Japanese Journal of Applied Physics, vol. 27, No. 6, Jun. 1988, pp. 1002-1004.

Plasmaabscheidung un-oxidation in der Halbleiterindudustrie, Elektronik Produktion & Prueftechnik, Jun. 1987, pp. 61-63.

Low-Temperature Process for High-Mobility Polysilicon TFTs, Electronics Letters, vol. 23, No. 6, Mar. 12, 1987, pp. 288-289.

Primary Examiner—Brian E. Hearn
Assistant Examiner—B. Everhart
Attorney, Agent, or Firm—Hill, Steadman & Simpson

[57] ABSTRACT

A method for producing polycrystalline semiconductor material layers of, in particular, silicon by vapor phase deposition in a plasma reactor. Hydrogen in its activated condition is supplied to the reaction gas in the reactor through an additional gas feed. In an embodiment, the activation proceeds with a glow cathode located in the hydrogen gas feed. The method enables the deposition of uniform polycrystalline semiconductor material layers at substrate temperatures of from between approximately 100° to about 450° C. The deposition can be implemented onto normal glass substrates in a plasma reactor having a simple structure. The method can be used for the manufacture of transistors through thin-film technology.

9 Claims, 1 Drawing Sheet

METHOD FOR PRODUCING POLYCRYSTALLINE SEMICONDUCTOR MATERIAL BY PLASMA-INDUCED VAPOR PHASE DEPOSITION USING ACTIVATED HYDROGEN

This is a continuation of application Ser. No. 477,532, filed Feb. 9, 1990 now abandoned.

BACKGROUND OF THE INVENTION

The present invention is directed to a method for producing polycrystalline semiconductor material layers by vapor phase deposition. More specifically, the present invention is directed to a method wherein a gaseous compound containing the semiconductor material is decomposed in a plasma-induced manner in a reactor and the semiconductor material is deposited on substrates that are located in the reactor, hydrogen being added to the plasma.

An example of such a method, for the manufacture of silicon thin-film transistors, is set forth in Electronic Letters, Vol. 23, No. 6, pages 288/289 (Mar. 12, 1987). As disclosed therein, the deposition proceeds through a plasma-assisted chemical vapor deposition (CVD) onto special glasses. The deposition occurs at temperatures of approximately 580° C. The reaction gas consists of silane ($SiH_4$) mixed with hydrogen. The size of the crystallites are between 80 and 100 nm. The gases in the plasma are ionized approximately 1%.

In known procedures, high substrate temperatures are required for the deposition of polycrystalline layers. In these procedures, this is true even when the deposition occurs with the assistance of a plasma-assisted CVD. Due to the high temperatures, when it is required that the substrate is transparent, the use of silica glass, or of other special glasses, as a substrate is necessary.

It is known to add hydrogen to the plasma during these procedures. When hydrogen is added to the plasma, the growing layer (that can be composed, for example, of silicon) contains crystallites that are surrounded by amorphous silicon. This amorphous silicon is etched away in selective manner by activated hydrogen in the plasma. When sufficient hydrogen is present, the amorphous material can be etched away as it is created. The silicon crystallites then remain on the substrate. The silicon crystallites continue to grow and form a continuous film. A continuous layer of polycrystalline material can be created in this fashion.

The delivery of gaseous hydrogen to the flow discharge, promotes the formation of silicon crystallites. At low temperatures, however, it is not possible to achieve the formation of a continuous polycrystalline layer. In the plasma, only a small part of the hydrogen is activated. The limited amount of hydrogen so activated, however, is not sufficient to in turn etch the amorphous silicon away that arises.

SUMMARY OF THE INVENTION

The present invention provides a method for manufacturing thin and uniform polycrystalline semiconductor material layers of, in particular, silicon on inexpensive glass substrates at relatively low temperatures without greatly modifying known apparatus.

To this end, the present invention provides a method for producing polycrystalline semiconductor material layers by vapor phase deposition, wherein a gaseous compound containing the semiconductor material is decomposed in a plasma-induced manner in a reactor and a semiconductor material is deposited on substrates located in the reactor with hydrogen being added to the plasma. Pursuant to the present invention, the hydrogen is supplied to the plasma in an activated condition separate from the reaction gas.

In an embodiment of the method of the present invention, the activation of the hydrogen proceeds by ionization of the hydrogen in a hydrogen gas feed through the use of a glow cathode.

In an embodiment of the present invention, the activation of the hydrogen proceeds in the hydrogen gas feed through the use of microwaves.

In an embodiment of the present invention, the activation of the hydrogen proceeds optically in the hydrogen gas feed by utilizing ultraviolet light having a suitable wavelength.

In an embodiment of the present invention, silane ($SiH_4$) is used in the manufacture of semiconductor material layers composed of polycrystalline silicon. In an embodiment, the ratio of silane to hydrogen is set from approximately 1:10 to about 10:1. In a further embodiment, the substrates are held at a temperature of from approximately 100° C. to about 450° C.

In an embodiment of the method of the present invention, the method is used to manufacture thin-film semiconductor components based on silicon.

Additional features and advantages of the present invention are described in, and will be apparent from, the detailed description of the presently preferred embodiments and from the drawing.

BRIEF DESCRIPTION OF THE FIGURE

The FIG. 1 illustrates an apparatus for producing polycrystalline semiconductor material pursuant to the method of the present invention.

DETAILED DESCRIPTION OF THE PRESENTLY PREFERRED EMBODIMENTS

Figure 1:
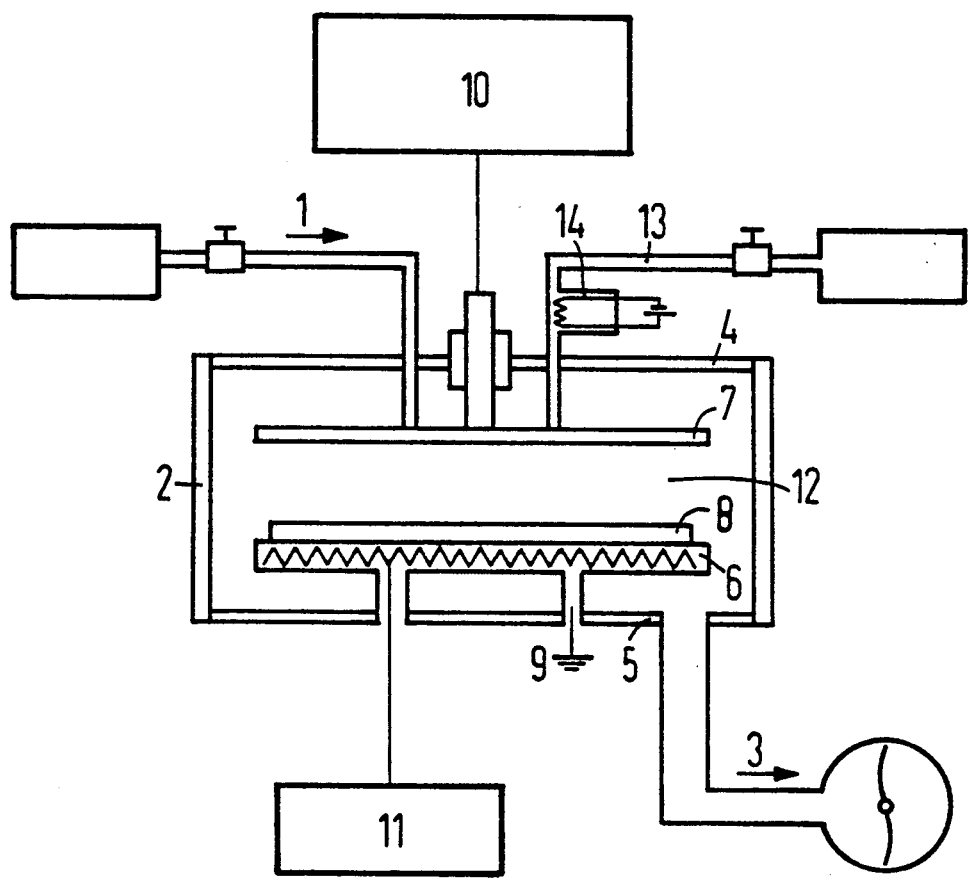

Pursuant to the present invention, a method is provided for producing polycrystalline semiconductor material layers by vapor phase deposition. The present invention is directed to the production of such layers by the decomposition of a gaseous compound containing the semiconductor material in a plasma-induced manner in a reactor, the semiconductor material being deposited on substrates that are located in a reactor. Pursuant to the present invention, hydrogen is supplied to the plasma in an activated condition separately from the reaction gas.

In an embodiment of the present invention, the activation of the hydrogen is carried out by ionization of the hydrogen in the hydrogen gas feed through the use of a glow cathode or by excitation with microwaves. In a preferred embodiment, the hydrogen is activated with a glow cathode located in the hydrogen gas feed. In an embodiment, the activation of the hydrogen proceeds optically in the hydrogen gas feed through the use of ultraviolet light of a suitable wavelength.

Although Japanese Journal of Applied Physics, Vol. 26, No. 1, January 1987, pages L10–L13 describes a plasma-assisted CVD process for silicon wherein low substrate temperatures are possible and the hydrogen participates in the reaction in its activated condition, the activation nonetheless occurs directly in the substrate region together with the reaction gas composed of silicon tetrafluoride ($SiF_4$). This requires an extremely complex apparatus having a coaxial microwave-plasma system.

In the method of the present invention, the hydrogen is placed in an activated condition separate from the reaction gas. Therefore, when the hydrogen encounters the reaction gas in the glow discharge it is in an activated condition.

Pursuant to the present invention, complex apparatus are not required. Instead, only an additional connection for the hydrogen gas is required to typically used apparatus. The activation of the hydrogen occurs in the gas feed, for example, with a glow cathode. Accordingly, typical plasma-assisted CVD system can be modified and perform the method utilized for deposition of the present invention.

Pursuant to the present invention, the substrate temperature can be set to approximately 300° C. or below. Accordingly, the present invention makes it possible to produce polycrystalline layers on normal glass substrates. Therefore, pursuant to the present invention, the use of silica glasses or of other special glasses is not required.

Referring now to the Figure, an apparatus for performing the method of the present invention is illustrated. The gaseous compounds for producing a polycrystalline layer, for example n-doped silicon layer and composed of, for example, silane ($SiH_4$) and phosphine ($PH_3$), are introduced through a first feed in the direction of the arrow referenced 1 into the reactor 2, that primarily consists of silica in this region. The reactor 2 has been previously evacuated down to a pressure of about $10^{-6}$ mbar through a connection referenced with the arrow 3.

As illustrated, the reactor 2 is closed at its top and bottom by a cover 4 and base plate 5. The cover 4 and base plate 5 are constructed from stainless steel and contain bushings for electrodes 6 and 7. The electrodes 6 and 7 are arranged horizontally and parallel to one another in the reactor 2.

The electrode 6 functions to support substrates 8 composed of glass. The electorde 6 is grounded at a location referenced 9. The glow discharge is initiated via the electrode 7 by the use of radio-frequency energy 10. The electrode 6 is heated to approximately 100° C. to about 450° C. by electrode heating 11. In the Figure, the plasma is indicated by 12.

The cover plate 4 of the reactor 2 includes a bushing for a hydrogen gas feed 13 that allows hydrogen gas to be fed into the reactor 2. In the embodiment of the invention illustrated, the hydrogen gas is activated by a flow cathode 14 that is located in the hydrogen gas feed 13.

In an embodiment of the present invention, it has been found that preferably, the flow ratio of silane $SiH_4$ (1) to hydrogen $H_2$ (13) is approximately 1:10 to about 10:1. The applied radio-frequency power (10) is preferably approximately 2 to about 100 mW/cm$^2$.

Utilizing the method of the present invention, the apparatus can be used to make thin-film semiconductor components based on silicon. The method enables the deposition of uniform polycrystalline semiconductor materials at substrate temperatures of from approximately 100° C. to about 450° C.

It should be understood that various changes and modifications to the presently preferred embodiments described herein will be apparent to those skilled in the art. Such changes and modifications can be made without departing from the spirit and scope of the present invention and without diminishing its attendant advantages. It is therefore intended that such changes and modifications be covered by the appended claims.

I claim:

1. A method for producing polycrystalline semiconductor material layers through plasma induced vapor deposition at low temperatures, wherein;

activated hydrogen and a gaseous compound containing the semiconductor material are separately introduced into a reactor, the gaseous compound being silane ($SiH_4$) and the ratio of silane to hydrogen is set from approximately 1:10 to about 10:1;

the semiconductor material is decomposed in a plasma-excited manner in the reactor and the semiconductor material is deposited on one or more substrates located in the reactor, wherein the substrates are heated to a temperature of from approximately 100° C. to about 450° C.; and growth of amorphous material on the substrates is etched away and suppressed by the activated hydrogen thereby promoting uniform growth of layers of the polycrystalline semiconductor material.

2. The method of claim 1 wherein the activation of the hydrogen is achieved by ionization of the hydrogen in a hydrogen gas feed through the use of a glow cathode.

3. The method of claim 1 wherein the activation of the hydrogen is achieved in a hydrogen gas feed through the use of microwaves.

4. The method of claim 1 wherein the activation of the hydrogen is achieved optically in a hydrogen gas feed with ultraviolet light having a suitable wavelength.

5. A method for manufacturing semiconductor components based on silicon in thin-film technology comprising the steps of:

decomposing a gaseous compound containing the semiconductor material in a plasma-induced manner in a reactor so that the semiconductor material is deposited on substrates located in the reactor, wherein the gaseous compound is silane ($SiH_4$) and the substrates are heated to a temperature of from approximately 100° C. to about 450° C.;

adding hydrogen in an activated condition to the plasma, the hydrogen being activated in a hydrogen gas feed that is separate from a reaction gas feed, and wherein the ratio of silane to hydrogen is set from approximately 1:10 to about 10:1; and suppressing growth of amorphous material on the substrates by the introduction of the activated hydrogen thereby promoting uniform growth of the polycrystalline semiconductor layers.

6. The method of claim 5 wherein the activation of the hydrogen is achieved through the use of a glow cathode.

7. The method of claim 5 wherein the activation of the hydrogen is achieved with microwaves.

8. The method of claim 5 wherein the activation of the hydrogen is achieved optically with ultraviolet light.

9. A method for manufacturing transistors comprising producing polycrystalline semiconductor material layers in a method comprising the steps of:

separately introducing a gaseous compound containing the semiconductor material and activated hydrogen into a reactor, the gaseous compound being silane ($SiH_4$);

decomposing the gaseous compound containing the semiconductor material in a plasma-induced manner in the reactor so that the semiconductor material is deposited on substrates located in the reactor, wherein the substrates are heated to a temperature of from approximately 100° C. to about 450° C.;

adding the hydrogen in an activated condition to the plasma, the hydrogen being activated in a hydrogen gas feed that is separate from a reaction gas feed, the hydrogen being activated by aglow cathode located in the hydrogen gas feed; and setting the ratio of silane to hydrogen to approximately 1:10 to about 10:1.

* * * * *